United States Patent
Braun et al.

(10) Patent No.: US 10,403,576 B2
(45) Date of Patent: Sep. 3, 2019

(54) METHOD FOR MANUFACTURING AN ELECTRONIC COMPONENT AND AN ELECTRONIC COMPONENT

(71) Applicant: Fraunhofer-Gesellschaft zur Förderung der angewandten Forschung e.V., München (DE)

(72) Inventors: Tanja Braun, Berlin (DE); Karl-Friedrich Becker, Berlin (DE); Ruben Kahle, Berlin (DE); Michael Töpper, Berlin (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 2 days.

(21) Appl. No.: 15/284,726

(22) Filed: Oct. 4, 2016

(65) Prior Publication Data
US 2017/0098611 A1    Apr. 6, 2017

(30) Foreign Application Priority Data

Oct. 5, 2015    (DE) .................... 10 2015 219 190

(51) Int. Cl.
*H01L 21/48*    (2006.01)
*H01L 23/31*    (2006.01)
(Continued)

(52) U.S. Cl.
CPC ........ *H01L 23/5387* (2013.01); *H01L 21/486* (2013.01); *H01L 21/4846* (2013.01);
(Continued)

(58) Field of Classification Search
CPC ............. H01L 23/5387; H01L 23/4985; H01L 23/3121; H01L 23/315; H01L 25/0655
See application file for complete search history.

(56) References Cited

U.S. PATENT DOCUMENTS 6,225,688 B1 * 5/2001 Kim .................... H01L 23/5387
                                                              257/686
6,462,412 B2 * 10/2002 Kamei ................ H01L 23/4985
                                                              257/696
(Continued)

FOREIGN PATENT DOCUMENTS

DE          19747177 A1    4/1999
DE    102012207593 A1    11/2013
(Continued)

OTHER PUBLICATIONS

"German Application Serial No. 10 2015 219 190.7, Office Action dated May 3, 2016", (dated May 3, 2016), 5 pgs.
(Continued)

*Primary Examiner* — Mark W Tornow
*Assistant Examiner* — Abbigale A Boyle
(74) *Attorney, Agent, or Firm* — Schwegman Lundberg & Woessner, P.A.

(57) ABSTRACT

A method for manufacturing an electronic component can include the following steps: providing a semiconductor arrangement comprising a carrier structure which has at least one semiconductor chip incorporated into a potting compound, and a redistribution layer which comprises a flexible material and at least one strip conductor, wherein the carrier structure at least in regions is connected to the redistribution layer, and the at least one semiconductor chip is electrically conductively connected to the redistribution layer, and separating the carrier structure along at least one trench in a manner such that the carrier structure is divided into at least two singularized carrier elements, wherein two adjacent ones of the singularized carrier elements are connected to one another over the respective trench by way of the redistribution layer.

11 Claims, 8 Drawing Sheets

(51) Int. Cl.
*H01L 23/498* (2006.01)
*H01L 23/538* (2006.01)
*H01L 23/00* (2006.01)
*H01L 21/56* (2006.01)
*H01L 25/065* (2006.01)

(52) U.S. Cl.
CPC ........ *H01L 21/565* (2013.01); *H01L 23/3121* (2013.01); *H01L 23/4985* (2013.01); *H01L 23/5384* (2013.01); *H01L 23/5386* (2013.01); *H01L 24/96* (2013.01); *H01L 25/0655* (2013.01); *H01L 21/568* (2013.01); *H01L 2224/04105* (2013.01); *H01L 2224/24137* (2013.01); *H01L 2924/15311* (2013.01); *H01L 2924/1815* (2013.01)

(56) References Cited

U.S. PATENT DOCUMENTS

| | | | | |
|---|---|---|---|---|
| 6,486,544 | B1 * | 11/2002 | Hashimoto | H01L 21/563 257/686 |
| 6,724,090 | B2 * | 4/2004 | Choi | H01L 23/5387 257/685 |
| 6,972,482 | B2 * | 12/2005 | Salta, III | H01L 23/3121 257/686 |
| 7,067,352 | B1 * | 6/2006 | Scheid | H01L 24/24 257/E21.705 |
| 7,149,095 | B2 * | 12/2006 | Warner | H01L 23/5387 361/803 |
| 8,072,058 | B2 * | 12/2011 | Kim | H01L 25/0657 257/678 |
| 9,184,139 | B2 * | 11/2015 | Choi | H01L 24/97 |
| 2003/0164548 | A1 * | 9/2003 | Lee | H01L 23/13 257/738 |
| 2004/0147064 | A1 | 7/2004 | He | |
| 2004/0209400 | A1 | 10/2004 | Meyers | |
| 2005/0026328 | A1 | 2/2005 | Watanabe | |
| 2009/0309197 | A1 | 12/2009 | Chow et al. | |
| 2017/0338453 | A1 * | 11/2017 | Yu | H01L 23/3121 |

FOREIGN PATENT DOCUMENTS

| | | |
|---|---|---|
| EP | 2071618 A2 | 6/2009 |
| FR | 2917895 A1 | 12/2008 |

OTHER PUBLICATIONS

"European Application Serial No. 16191719.0 Extended European Search Report dated Feb. 24, 2017", (dated Feb. 24, 2017), 8 pgs.

* cited by examiner

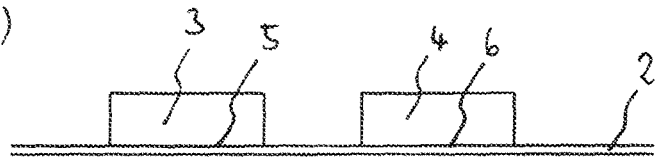
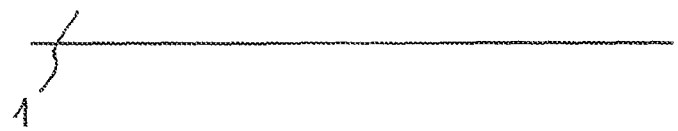
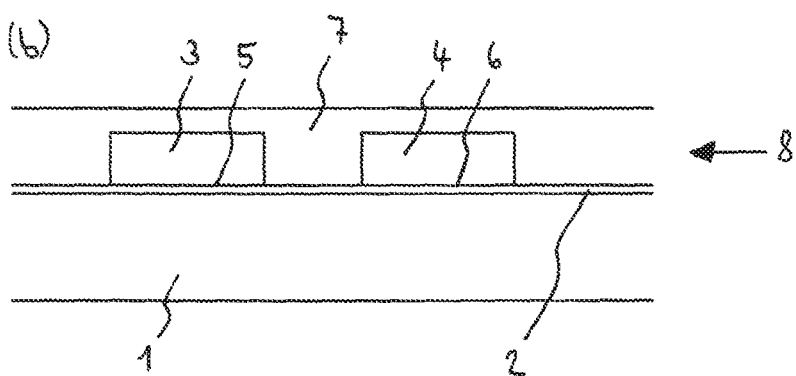
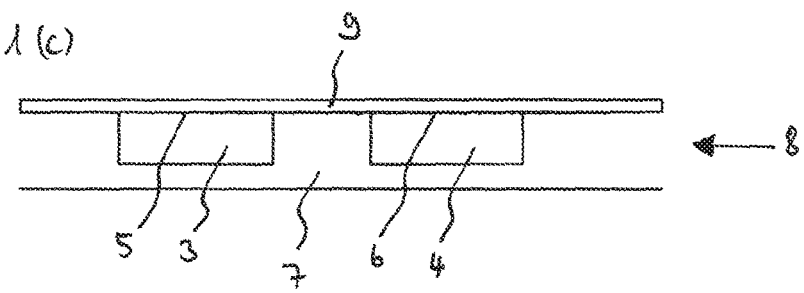
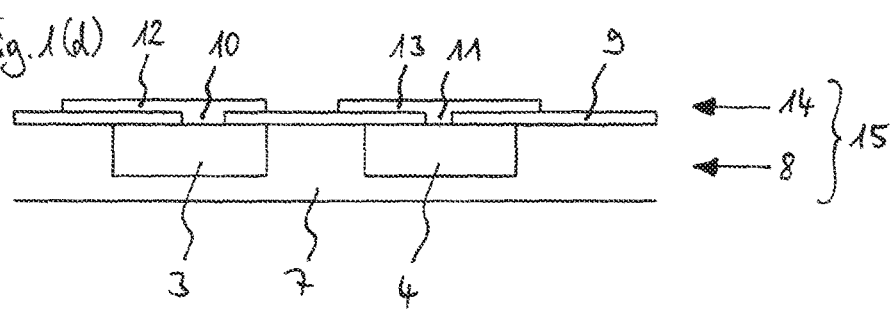

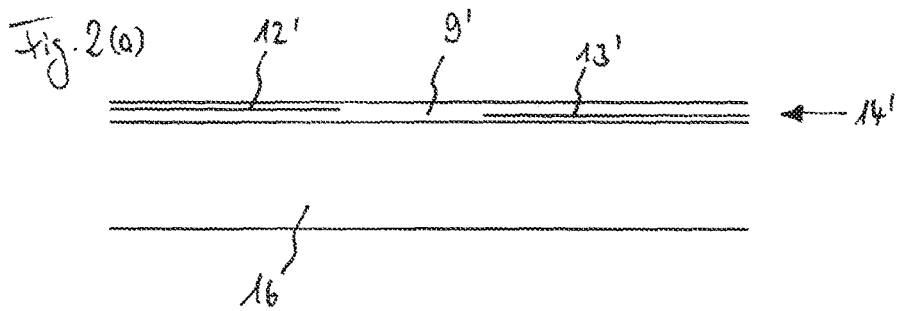
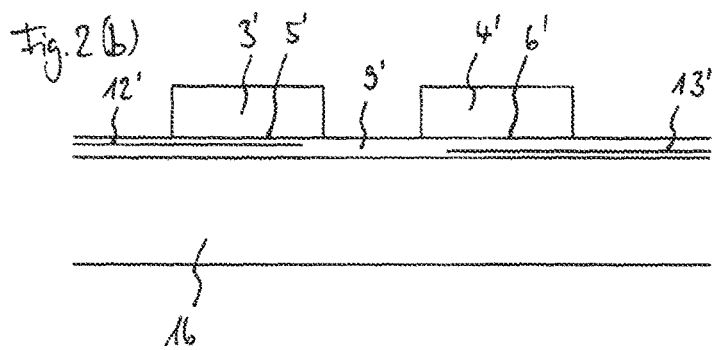
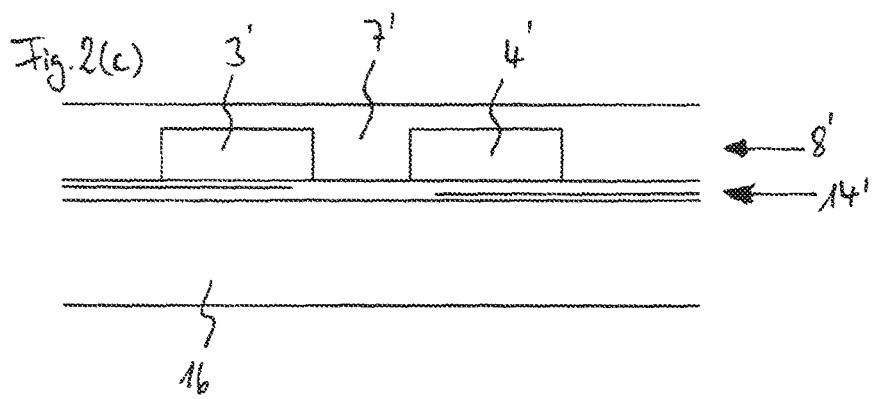
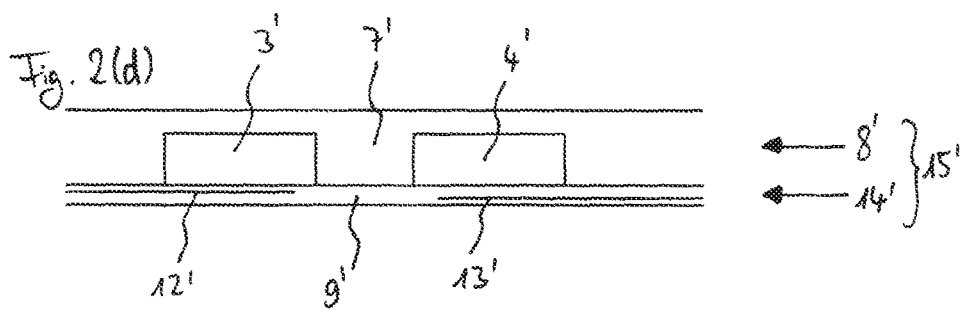

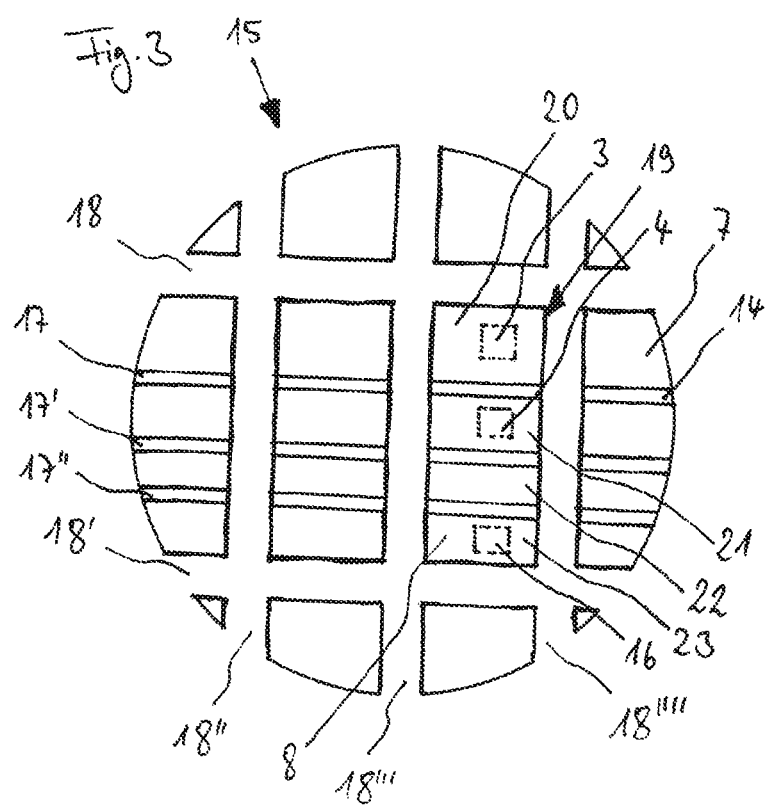

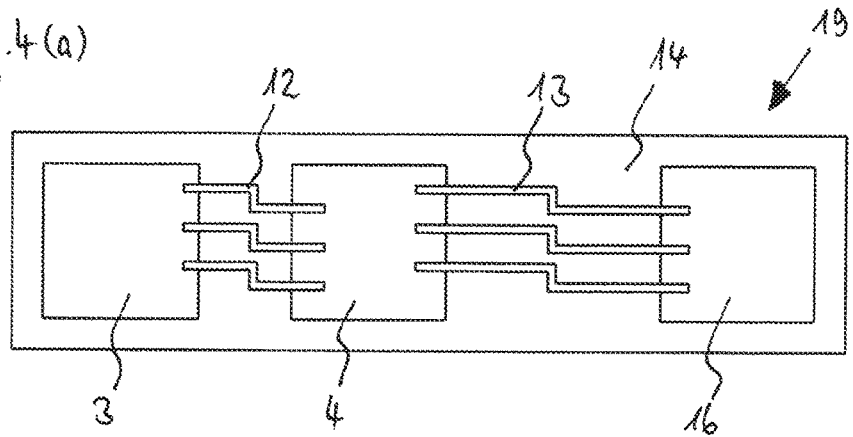
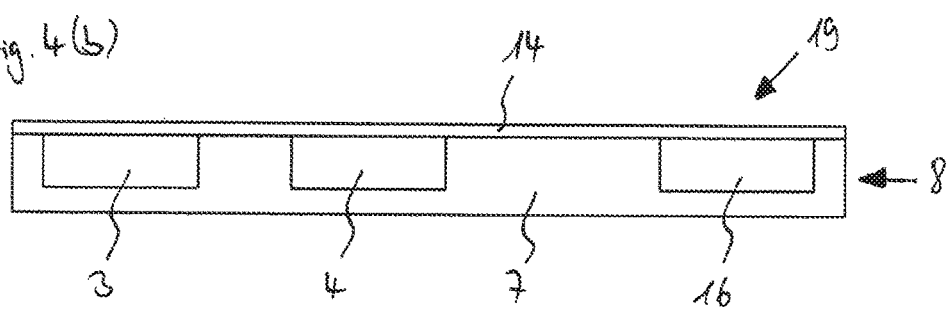
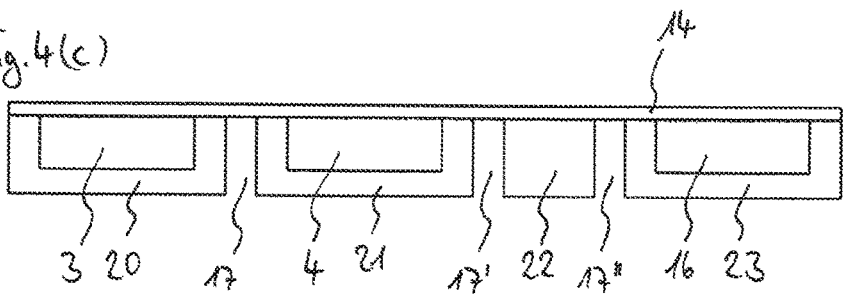
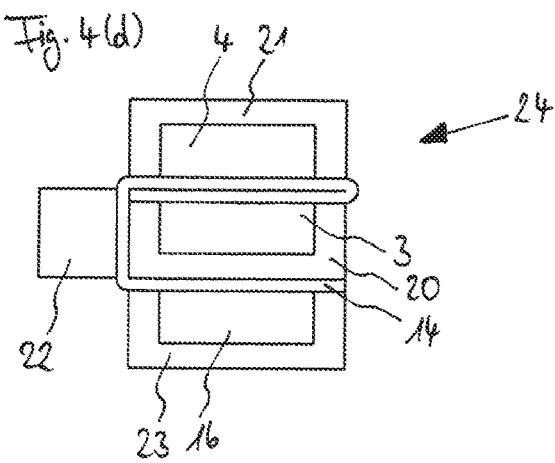

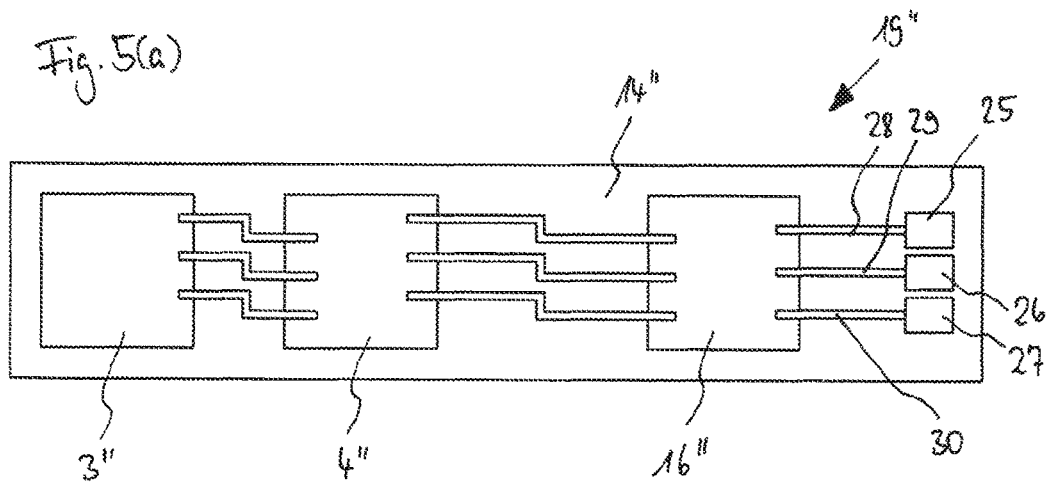
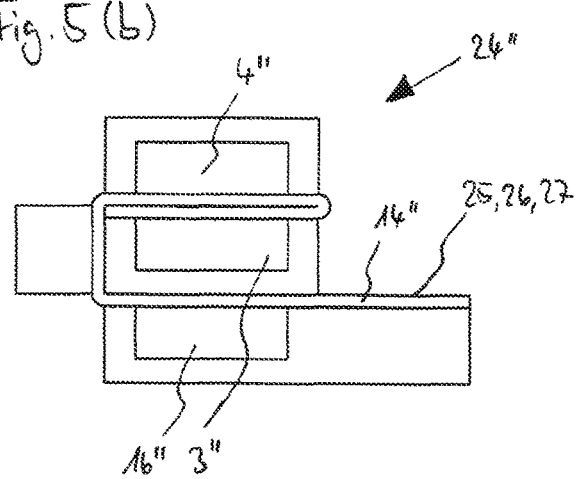

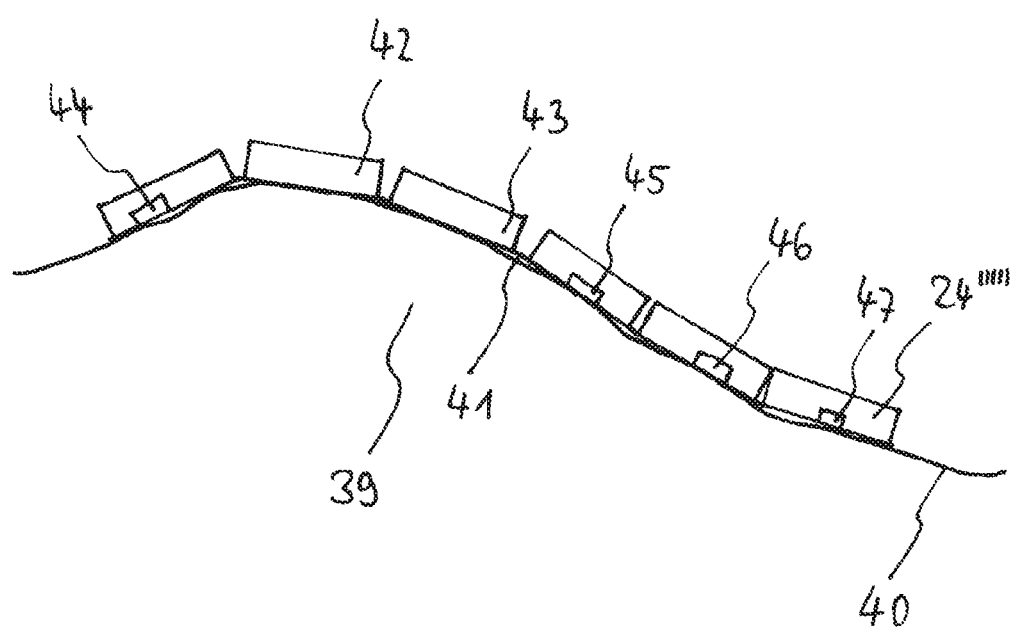

METHOD FOR MANUFACTURING AN ELECTRONIC COMPONENT AND AN ELECTRONIC COMPONENT

PRIORITY APPLICATIONS

This application claims the benefit of priority of German Application Serial No. 10 2015 219 190.7, filed Oct. 5, 2015, which is incorporated herein by reference in its entirety.

The application relates to a method for manufacturing an electronic component and to an electronic component.

BACKGROUND

A method for manufacturing a housed, electronic component is described for example in the document DE 197 47 177 C2. There, a substrate comprising strip conductors and with a flexible region is folded by way of the bending the flexible region, such that different regions of the substrate which are provided with components are arranged above one another. A component which is manufactured in such a manner is characterised by a reduced spatial requirement compared to housing shapes which are based on a plane (two-dimensional) construction of circuits.

SUMMARY

It can be an object of the present subject matter, to provide a method for manufacturing an electronic component which can be variably adapted to different application geometries. In particular, it can be an object of the present subject matter, to suggest a simplified method for manufacturing an electronic component with a reduced surface area requirement.

This object can be achieved by a method with the features of the main claim. Advantageous further developments are to be deduced by the features of the dependent claims and of the embodiment examples.

With regard to the described method for manufacturing an electronic component, a semiconductor arrangement comprising a carrier structure and a redistribution layer (rewiring layer) is made available. The carrier structure comprises at least one semiconductor chip which is incorporated into a potting compound. The redistribution layer comprises flexible material and at least one strip conductor, wherein the carrier structure at least regionally is connected to the redistribution layer, and the at least one semiconductor chip is connected to the redistribution layer in an electrically conductive manner. The carrier structure is subsequently separated along at least one trench (isolating trench), in a manner such that the carrier structure is divided into at least two singularized carrier elements, wherein two adjacent ones of the singularized carrier elements are connected to one another over the respective trench by way of the redistribution layer.

A component which is manufactured according to the suggested method is bendable in the region of a trench. For example, one can envisage the redistribution layer being bent by a certain angle in the region of the trench, after the separation. This embodiment permits a three-dimensional arrangement of the semiconductor chip, so that electronic components for example with a reduced surface area requirement can be manufactured or that electric components which are suitable for an attachment of the component on a curved surface envisaged for this can be manufactured.

Manufacturing steps, such as a manufacture of strip conductors and electrical contacts to the semiconductor chips, can advantageously be carried out Whilst the semiconductor chips are arranged next to one another, on account of the suggested method. A three-dimensional arrangement of the semiconductor chip can be achieved upon the step of the bending. This for example permits a simplified manufacture of three-dimensional electronic components.

A predefined or given angle can be selected for example in a manner such that two adjacent ones of the singularized carrier elements have an angle of more than 2 degrees, preferably more than 5 degrees, particularly preferably more than 10 degrees, after the bending at the region of the redistribution layer which is arranged between the two adjacent carrier elements.

An electrically conductive contact between the different regions of the at least one semiconductor chip or between the at least one semiconductor chip and, as the case may be, connection locations which are provided on the redistribution layer and are for the connection of the semiconductor chip to further components, can be created by the strip conductors of the redistribution layer. The connection locations, such as contact pads, solder contacts or plug-in contacts for example can hereby be distributed over a surface area of the redistribution layer which is significantly greater than a surface of the semiconductor chip. If the electronic component comprises several semiconductor chips, then the strip conductors can serve for a creation of an electrically conductive connection of the semiconductor chips amongst one another.

The electronic components for example can comprise at least two, at least three or at least four semiconductor chips. The electronic component for example can comprise ten semiconductor chips. One can envisage, upon reading the present disclosure, each of the singularized carrier elements comprising exactly one semiconductor chip. Alternatively, one can envisage some or all of the singularized carrier elements having more than one semiconductor chip. One can also envisage at least one of the singularized carrier elements having no semiconductor chip. It is also possible for the electronic component, additionally to the at least one semiconductor chip, to comprise further electronic components, for example application-specific integrated circuits, sensors or passive components such as capacitors, resistors, coils or antennae, which are electrically conductively connected to the redistribution layer. These further electronic components can also be embedded into the carrier structure or into the singularized carrier elements.

At least some of the strip conductors can be designed in a flexible manner, so that an electrical connection which is created by the strip conductors and which is in the region of the trench is not interrupted by a bending of the redistribution layer in this region. The strip conductors for example can comprise metals or electrically conductive polymers.

The carrier structure can be designed as part of an artificial or reconfigured wafer. The artificial wafer can have an essentially rectangular panel shape or an essentially round water shape. Cuts are typically carried out on manufacture of the electronic component, with which cuts the carrier structure and the redistribution layer are severed. Regions, from which the electronic component is manufactured by way of the suggested method, can be separated out of a reconfigured wafer in this manner.

The trenches can reach essentially up to the redistribution layer. In particular, one can envisage the trenches partly reaching into the redistribution layer. The separation for example can be effected by way of sawing, lasering, milling or water-jet cutting. The trenches at the widest location can have a width between 25 and 500 µm, preferably between 100 and 200 µm.

One can envisage, upon reading the present disclosure, the flexible material comprising a flexible polymer. The flexible material for example can comprise silicone, polyimide, epoxy resin or polyurethane. The flexible material is typically an electrically isolating material.

On manufacture of the electronic component, one can envisage the redistribution layer being bent in the region of a trench, in a manner such that at least two of the singularized carrier elements are arranged in an at least partly overlapping manner. A compact constructional shape of an electronic component, with which the electronic component has a reduced surface area requirement, can be achieved by way of the overlapping of the singularized carrier elements.

One can also envisage the flexible material being a foldable material, and the redistribution layer being folded at the region of a trench, in a manner such that at least two adjacent ones of the singularized carrier elements are arranged in an at least partly overlapping manner. A folding in the context of this application is to be understood as a high bending, which is to say a bending with a low radius of curvature and over a large bending angle. A particularly compact constructional manner of the electronic component can be achieved by a folding of adjacent, singularized carrier elements and their overlapping.

Hereby, typically at least some of the strip conductors are designed in a foldable manner, so that an electrical connection in the region of the trench and created by the strip conductors is not interrupted by a folding of the redistribution layer at this region.

The carrier structure can be separated along several trenches into several singularized carrier elements which are connected to one another via the redistribution layer, wherein the several trenches run essentially in parallel. A space-saving stacking of the singularized carrier elements can be achieved by way of bending, on account of the trenches running in parallel.

One can moreover envisage, upon reading the present disclosure, at least two adjacent ones of the trenches having a distance which corresponds essentially to a singular or multiple height of the carrier structure and of the redistribution layer. A particularly compact embodiment of the electronic component can be achieved by way of this, with which the singularized carrier element which is arranged between the adjacent trenches is orientated essentially perpendicularly to the other singularized carrier elements after the bending. The height of the carrier structure can be between 100 and 500 μm, preferably between 150 and 250 μm.

With regard to the method for manufacturing an electronic component, and in one embodiment, a through-contact through the carrier structure is created in a manner such that an electrically conductive connection is created between the redistribution layer and a side of the carrier structure which is away from the redistribution layer.

A through-contact for example permits an electrical connection between the redistribution layer and components, such as passive or active electronic components, which as the case may be are arranged on a side of singularized carrier element which is away from the redistribution layer, or connection locations, such as solder contacts or contact pads. An antenna for example can be arranged on a side of one of the singularized carrier element which is away from the redistribution layer.

The strip conductors of the redistribution layer can also be designed in a multi-layered manner, so that the strip conductors can cross, without these being electrically conductively connected to one another. Such an embodiment permits additional possibilities with regard to the redistribution of the electrical contacts.

In an embodiment, the present disclosure envisages two adjacent ones of the singularized carrier elements turning away from one another on bending. Such a bending is particularly suitable in the case of a low width of the trench or with a height of the carrier structure which is comparable to the width of the trench or is larger. Bendings in the form of folds with a fold angle of up to 180 degrees can be achieved by way of this.

The separation of the carrier structure can effected by way of at least one V-cut which is tapered in the direction of the redistribution layer. One can also envisage the separation being effected in a manner such that two adjacent trenches are tapered in the direction of the redistribution layer. The can run in parallel and have a distance which corresponds essentially to twofold the height of the carrier structure.

One can hereby envisage the two adjacent ones of the singularized carrier elements turning to one another on bending. It is particularly with two such bendings along adjacent trenches which were created by a V-cut, that a particularly compact embodiment of the electronic component can be achieved.

One can envisage at least one semiconductor chip being firstly provided, for providing the semiconductor arrangement. The at least one semiconductor chip can be subsequently arranged on a substrate. One can envisage the at least one semiconductor chip being potted, so that the carrier structure is formed, wherein this carrier structure comprises the potting compound and the at least one semiconductor chip which is incorporated therein. The redistribution layer which is connected at least regionally to the carrier structure can thereupon be manufactured, and this layer encompasses the flexible material and the at least one strip conductor in a manner such that the redistribution layer electrically contacts the at least one semiconductor strip, wherein the semiconductor arrangement is formed from the carrier structure and the redistribution layer. One can envisage the semiconductor arrangement being detached from the substance in a further step.

One can also envisage a substrate firstly being provided for providing the semiconductor arrangement, on which substrate the redistribution layer comprising the flexible material and the at least one strip conductor is subsequently manufactured. Thereupon, the at least one semiconductor chip can be arranged on the redistribution layer. One can envisage an electrical contact being created between the at least one semiconductor chip and the redistribution layer. In a further step, the at least one semiconductor chip can be potted with the potting compound, so that the carrier structure comprising the potting compound and the at least one semiconductor chip incorporated therein is formed, wherein the semiconductor arrangement is formed from the carrier structure and the redistribution layer. In a further step, one can envisage the semiconductor arrangement being detached from the substrate.

The invention moreover relates to an electronic component which comprises at least three carrier elements which are singularized along at least one trench and which each comprise a potting compound. At least one semiconductor chip is integrated into at least one of the singularized carrier elements. The electronic component moreover comprises a redistribution layer which comprises the flexible material and at least one strip conductor. The singularized carrier elements are connected to the same side of the redistribution layer, the at least one semiconductor chip is electrically conductively connected to the redistribution layer, at least three adjacent ones of the singularized carrier elements are connected to one another via the redistribution layer, and the redistribution layer is bent in a region of one of the trenches in a manner such that at least two of the singularized carrier elements are arranged in a manner in which they are at least partly overlapping one another. The redistribution layer is moreover bent in a manner such that at least two of the singularized carrier elements are arranged essentially perpendicularly to one another. A particularly compact constructional shape of the electronic component can be achieved in this manner.

The present subject matter moreover relates to an electronic component which is manufactured by way of the method described above.

BRIEF DESCRIPTION OF THE DRAWINGS

Embodiment examples of the present subject matter are hereinafter described by way of drawings. There are shown in:

FIG. 1(a)-(d) a schematic representation of method steps for manufacturing a semiconductor arrangement, FIG. 2(a)-(d) a schematic representation of further method steps for manufacturing semiconductor arrangement, FIG. 3 a schematic view of a semiconductor arrangement in the form of a reconfigured wafer, FIG. 4(a)-(d) different schematic views of a package, as well as an electronic component, FIG. 5(a), (b) a schematic view of a further package, as well as a further electronic component, FIG. 6(a), (b) a schematic view of a further package, as well as a further electronic component, FIG. 7(a), (b) a schematic view of a further package, as well as a further electronic component, and FIG. 8 a schematic view of an electronic component and a contour of an object.

DETAILED DESCRIPTION

Figure 6:
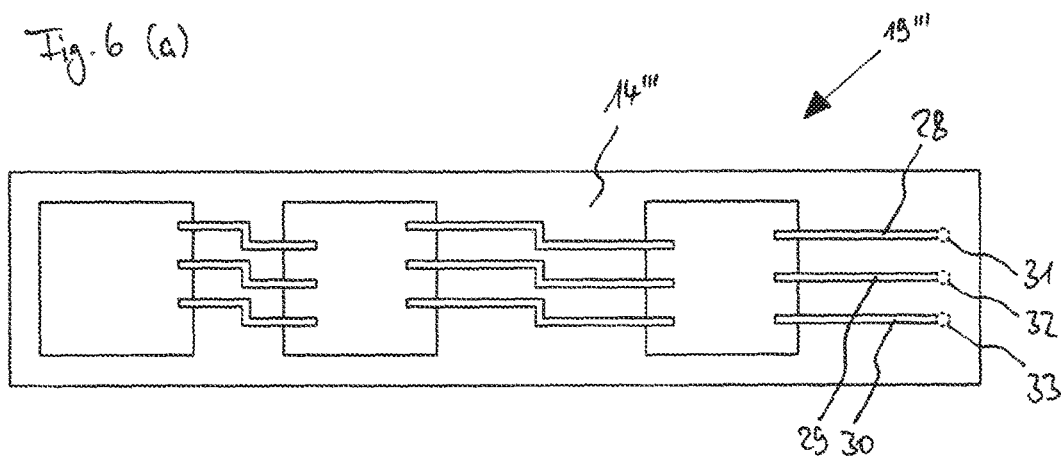
Figure 6:
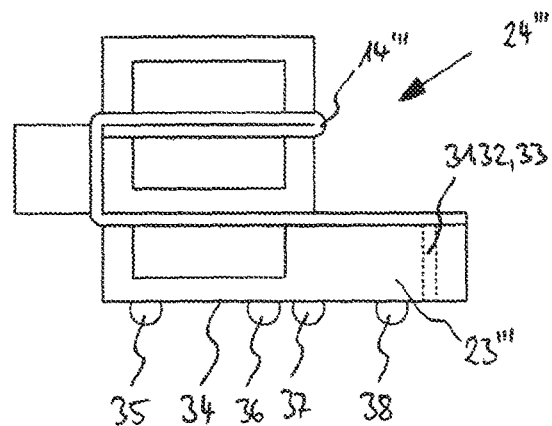

FIGS. 1(a) to 1(d) show several views of a method for manufacturing a semiconductor arrangement. A substrate 1 as well as a heat-detachable foil 2 which is arranged thereon is shown in FIG. 1(a). A first semiconductor chip 3 and a second semiconductor chip 4 are firstly arranged next to one another on the substrate 1 and the foil 2, wherein the semiconductor chips 3, 4 each with an electrically active side 5, 6 lie on the foil 2.

The semiconductor chips 3, 4 for example can be sawn or split out of one or more semiconductor wafers. The semiconductor chips 3, 4 can for example comprise a chip substrate of silicon and have integrated circuits. Metallizations for the electrical contacting of the integrated circuits can be provided on the electrically active side 5, 6.

The semiconductor chips are subsequently potted into a potting compound 7, as is shown in FIG. 1(b). Recurring features in this picture and in the following pictures are provided with the same reference numerals.

The potting compound for example can comprise silicone and/or polyurethane, polyimide and or artificial resin, in particular epoxy resin. The potting compound 7 cures after the semiconductor chips 3, 4 have been potted into the potting compound 7, so that the potting compound 7 and the semiconductor chips 3, 4 which are embedded therein form a carrier structure 8.

The carrier structure 8 is thereafter detached from the foil 2 and the substrate 1 amid the heating of the heat-releasable foil 2. The carrier structure 8 is subsequently turned over, so that the electrically active sides 5, 6 of the semiconductor chips 3, 4 are directed upwards. A foldable which is to say flexible and electrically isolating material 9 is thereafter deposited onto the carrier structure 8 as is shown in FIG. 1(c). The electrically isolating material 9 is a foldable or flexible polymer. The electrically isolating material 9 for example comprises polyimide, epoxy resin, silicone, and/or benzocyclobutene. The electrically isolating material 9 forms a simply coherent layer.

Openings 10, 11, for example in the form of holes or trenches are subsequently incorporated into the electrically isolating material 9 at the locations, at which a later electrical contact to the semiconductor chips 3, 4 is desired. The openings 10, 11 can be formed for example by way of known methods from thin-film technology, such as wet or dry etching processes and/or amid the application of common, optical lithography methods. A regional Metallization, with gold or copper for example is thereafter effected, so that strip conductors 12, 13 contacting the semiconductor chips 3, 4 in the region of the openings 10, 11 are formed. Common optical lithographic methods can likewise be applied here. The strip conductors 12, 13 and the electrically isolating material 9 form a redistribution layer 14. The redistribution layer 14 and the carrier structure 8 connected to the redistribution layer 14 form a semiconductor arrangement 15.

FIGS. 2(a) to 2(d) show a further method for manufacturing a semiconductor arrangement. A further substrate 16 is represented in FIG. 2(a). The substrate for example can be a glass substrate. A redistribution layer 14' is firstly manufactured on this substrate, wherein the redistributing layer 14' comprises electrically conductive strip conductors 12', 13' and a foldable, which is to say flexible, electrically isolating material 9'. The strip conductors 12' 13' are arranged in different layers in the represented region of the redistribution layer 14.

Semiconductor chips 3', 4' with their electrically active sides 5', 6' are subsequently arranged next to one another on the redistribution layer 14', as is represented in FIG. 2(b). Recurring features in this picture and in the subsequent pictures are again provided with the same reference numerals.

Electrical contacts are created between the electrically active sides 5, 6 and the redistribution layer 14', on arranging the semiconductor chip 3', 4' on the redistribution layer 14' or after arranging the semiconductor chip 3', 4' on the redistribution layer 14'. Common methods, such as soldering, thermo-compression bonding, ultrasound bonding, laser soldering or a bonding with a conductive adhesive can be applied for creating these contacts. The strip conductors 12', 13' contact a respective one of the semiconductor ships 3', 4' after the creation of the electrical contacts.

The semiconductor chips 3', 4' are subsequently potted into a potting compound 7' which for example comprises silicone and/or polyurethane, polyimide and/or artificial resin, in particular epoxy resin, so that the potting compound 7' completely covers the semiconductor chips 3', 4' and the redistribution layer 14', as is shown in FIG. 2(c). The potting compound 14' subsequently cures. The potting compound 14 as well as the semiconductor chips 3', 4' form a carrier structure 8'.

The carrier structure 8' and the redistribution layer 14' are subsequently detached from the substrate 16 together, so that the semiconductor arrangement 15' represented in FIG. 2(d) is obtained.

The semiconductor arrangement 15 is represented in a schematic view in FIG. 3. The semiconductor arrangement 15 has an essentially round shape, which corresponds to the outline of the substrate 1 which is not represented here. The semiconductor arrangement 15 forms a reconfigured wafer which comprises the potting compound 7 and the semiconductor chip 3, 4 which is received in the potting compound 7. A further semiconductor chip 16 which is received into the potting compound 7 is additionally shown. The semiconductor arrangement 15 moreover comprises the redistribution layer 14.

In another embodiment, one can envisage the semiconductor arrangement 15 being manufactured in a polygonal panel format.

The semiconductor arrangement 15 comprises three trenches 17, 17', 17" which run in parallel and along which the carrier structure 8 was separated. For the separation, the semiconductor arrangement 15 was thinned out in the direction of the redistribution layer 14 by way of sawing, so that the trenches 17, 17, 17" arose. The thinning-out was terminated as soon as the redistribution layer 14 was reached. The trenches 17, 17', 17" thus have a depth which corresponds to the thickness of the carrier structure 8.

The semiconductor arrangement 15 additionally comprises cutting lines 18, 18, 18", 18''', 18'''', along which the semiconductor arrangement 15 is completely severed. A package 19 is formed by way of this, and this package comprises four singularized carrier elements 20, 21, 22, 23 which are connected in the region of the trenches 17, 17', 17" via the redistribution layer 14. One of the semiconductor chips 3, 4, 16 is embedded into three carrier elements 20, 21, 23 in each case.

FIG. 4(a) shows a schematic view onto the package 19. The redistribution layer 14 with strip conductors, of which two are provided with the reference numerals 12 and 13 by way of example, is represented. The semiconductor chips 3, 4, 16 which in this view are arranged behind the redistribution layer 14 are additionally indicated in this view.

A lateral view of the package 19 with the carrier structure 8 of the potting compound 7 and of the semiconductor chips 3, 4, 16, and with the redistribution layer 14 is represented schematically in FIG. 4(b). The package 19 was separated out of the reconfigured wafer. Trenches are not represented this example. FIG. 4(c) shows the some view after the trenches 17, 17', 17" have been created, so that the package 19 is divided up into singularized carrier elements 20, 21, 22, 23 which are connected to one another in the region of the trenches 17, 17', 17" via the redistribution layer 14.

A distance between the trenches with the reference numerals 17' and 17" is hereby selected in a manner such that this distance corresponds to a height of the carrier structure 8 and of redistribution layer 14, and thus to a height of each of the singularized carrier elements 20, 21, 22, 23 and of the redistribution layer 14.

For manufacturing an electronic component 24, the redistribution layer 14 of the package 19 represented in FIG. 4(c) is bent in the region of the trenches 17, 17', 17", such that the singularized carrier elements 20, 21, 22, 23 turn away from one another on bending. Hereby, the package 19 is firstly folded by 180 degrees in the region of the trench with the reference numeral 17, so that the carrier element with the reference numeral 21 is arranged above the carrier element with the reference numeral 20. The package 19 in the region of the trench with the reference numeral 17' is then bent at a right angle, so that the carrier element is with the reference numeral 22 is aligned in a vertical manner. Finally, the package 19 in the regions of the trench with the reference numeral 17" is bent at a right angle, so that the carrier element with the reference numeral 23 is arranged below the carrier element with the reference numeral 20.

The arrangement resulting from the described bending is represented in FIG. 4(d). The represented electronic component 24 comprises four singularized carrier elements 20, 21, 22, 23. The carrier elements with the reference numerals 20, 21 and 23 are arranged completely overlapping one another in the shown example, whereas the carrier element with the reference numeral 22 is arranged perpendicularly to the other carrier elements 20, 21, 23.

A further example of a package 19" is represented in FIG. 5(a). This package 19" differs from the package 19 represented in FIG. 4(a) in that the redistribution layer 4" comprises bond-pads 25, 26, 27. The bond pads 25, 26, 27 are electrically conductively connected to strip conductors 28, 29, 30 which in him are electrically conductively connected to at least one of three semiconductor chips 3", 4", 16".

An electronic components 24" which is formed from the package 19" by way of bending and which can be electrically connected to further electronic components or to a circuit board, for example by way of wire bonding onto the bond pads 25, 26, 27, is shown in FIG. 5(b).

It is also possible for the electronic component 24", additionally to the bond pads 25, 26, 27 or instead of the bond pads 25, 26, 27, to comprise electronic components, such as resistors, capacitors or antennae for example, which are arranged on the redistribution layer 14" and are connected to the strip conductors 28, 29, 30 in an electrically conductive manner.

A further embodiment of the package 19''' is shown in FIG. 6(a). This package 19''' differs from the packages 19, 19" mentioned above in that its redistribution layer 14''' comprises three electrically conductive through-contacts 31, 32, 33 which are connected to respective ones of the strip conductors 28, 29, 30 in an electrically conductive manner. The through-contacts 31, 32, 33 can be manufactured by way of conventional circuit board technology.

As is to be recognised in FIG. 6(b), the through-contacts 31, 32, 33 in the finished, bent electronic component 24''' extend from the redistribution layer 14''' up to a rear side 34 of the singularized carrier element provided with the reference numeral 23'''. Solder balls 35, 36, 37, 38, which are electrically conductively connected to the through-contacts 31, 32, 33 are arranged on the rear side 34 of the carrier element 23'''. The solder balls 35, 36, 37, 38 are configured to connect the electronic component 24''' to conductive regions which are provided on an upper side of the circuit board.

It is also possible for the electronic component 24''' additionally to the solder balls 35, 36, 37, 38 or instead of the solder balls 35, 36, 37, 38 to comprise electronic components such as for example resistors, capacitors or antenna, which are electrically conductively connected to the through-contacts 31, 32, 33, on the rear side 35 of the carrier element 23'''.

Figure 7A:
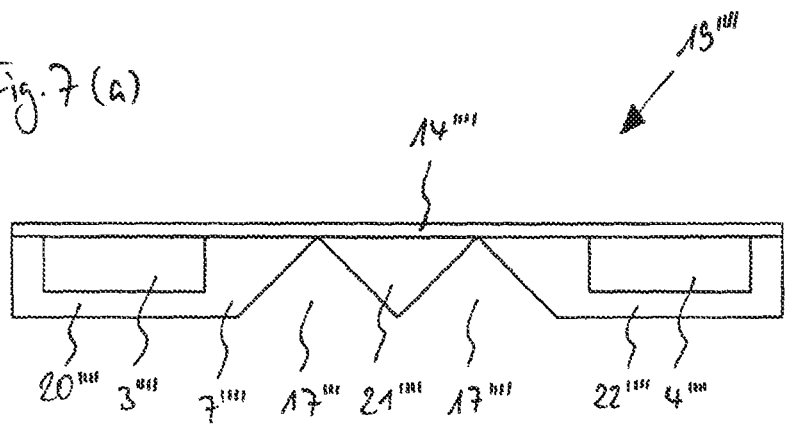

A package 19'''' is represented in a further embodiment in FIG. 7(a). This package 19'''' comprises three singularized carrier elements 20'''', 21'''', 22'''' which are connected in the regions of two trenches 17''', 17'''' via a redistribution layer 14''''. Two singularized carrier elements 20'''', 22'''' comprise semiconductor chips 3'''', 4'''' which are embedded into a potting compound 7''''. The trenches 17''', 17'''' are designed as V-cuts which taper in the direction of the redistribution layer 14''''. The V-cuts have a shape of an elongated recess which in the representation has a right angle in the region in a region facing the redistribution layer 14''''.

Figure 7B:
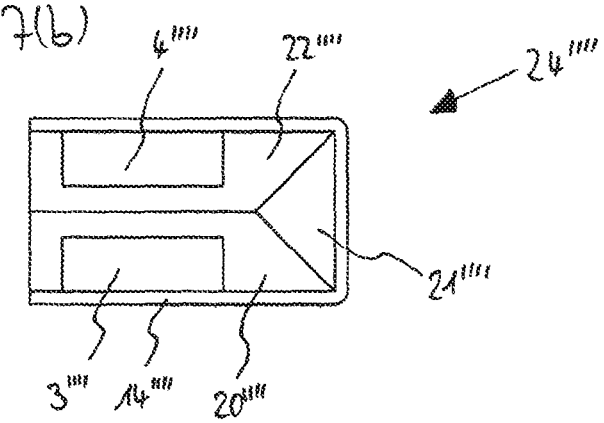

As is shown in FIG. 7(*b*), the package 19'''' can be bent into an electronic component 24'''', by way of the redistribution layer 14'''' being bent in the region of the trenches 17''', 17'''' such that the singularized carrier elements 20'''', 21'''', 22'''' turn to one another on bending. The singularized elements with the reference numerals 20'''' and 22'''' are arranged completely overlapping one another in the resulting arrangement. In the shown example, the carrier elements with the reference numerals 20'''' and 22'''' are arranged parallel to one another. However, it is also possible for packages with V-cuts to be created, whose cross sections have an obtuse angle in the region facing the redistribution layer 14'''', so that the carrier elements with the reference numerals 20'''' and 22'''' are arranged at an angle to one another after the bending. A preferred alignment of a sensor which as the case may be is embedded into the carrier element with the reference numeral 20'''', relative to the carrier element with the reference numerals 22'''', can be fixed in this manner.

An electronic component 24''''' is represented in FIG. 8. An object 39 whose surface 40 has a curved course is moreover represented. The electronic component 24''''' comprises a flexible redistribution layer 41, singularized carrier elements, of which two adjacent ones are characterised by the reference numerals 42 and 43 by way of example, various sensors 44, 45 and further semiconductor chips 46, 47. The redistribution layer 41 is fastened to the surface 40 of the object 39 with an adhesive, and is bent in a manner such that a course of the redistribution layer 41 roughly corresponds to the course of the surface 40. The redistribution layer 41 is bent between the singularized carrier elements with the reference numerals 42 and 43, such that the carrier elements 42, 43 are arranged at an angle of about 10 degrees to one another.

The features of the various embodiments which are disclosed in the embodiment examples can be combined with one another and claimed individually.

The invention claimed is:

1. A method for manufacturing an electronic component with the steps of:
    providing a semiconductor arrangement comprising a carrier structure having at least one semiconductor chip incorporated into a potting compound, further comprising a redistribution layer which has flexible material and at least one strip conductor, wherein the carrier structure at least in regions is connected to the redistribution layer, and the at least one semiconductor chip is electrically conductively connected to the redistribution layer;
    separating the carrier structure along at least one trench by removing portions of the potting compound, in a manner such that the carrier structure is divided into at least two singularized carrier elements, wherein two adjacent ones of the singularized carrier elements are connected to one another over the respective trench by way of the redistribution layer, wherein the separation of the carrier structure is effected by at least one V-cut in the potting compound, wherein the V-cut is tapered in the direction of the redistribution layer; and
    bending the redistribution layer about a predefined angle in the region of a trench such that inner surfaces of the V-cut lie flat against one another.

2. The method according to claim 1, comprising the step of:
    bending the redistribution layer in the region of a trench in a manner such that at least two of the singularized carrier elements are arranged at least partly overlapping one another.

3. The method according to claim 1, comprising the step of:
    folding the redistribution layer at the region of a trench, in a manner such that at least two adjacent ones of the singularized carrier elements are arranged overlapping one another at least partly, wherein the flexible material is a foldable material.

4. The method according to claim 1, wherein the flexible material comprises a flexible polymer.

5. The method according to claim 1, wherein the carrier structure is separated along several trenches into several singularized carrier elements which are connected to one another via the redistribution layer, wherein the several trenches run essentially in parallel.

6. The method according to claim 1, wherein at least two adjacent ones of the trenches have a distance which corresponds essentially to a singular or multiple of a height of the carrier structure and of the redistribution layer.

7. The method according to claim 1, comprising the step of:
    manufacturing a through-contact through the carrier structure, in a manner such that an electrically conductive connection is created between the redistribution layer and a side of the carrier structure which is away from the redistribution layer.

8. The method according to claim 1, wherein the two adjacent ones of the singularized carrier elements turn away from one another on bending.

9. The method according to claim 1, wherein the two adjacent ones of the singularized carrier elements turn to one another on bending.

10. The method according to claim 1, wherein the provision of the semiconductor arrangement comprises the following steps:
    providing the at least one semiconductor chip,
    arranging the at least one semiconductor chip on a substrate,
    potting the at least one semiconductor chip, so that the carrier structure comprising the potting compound and the at least one semiconductor chip incorporated therein is formed,
    manufacturing the redistribution layer which at least regionally is connected to the carrier structure and which comprises the flexible material and the at least one strip conductor, in a manner such that the redistribution layer electrically contacts the at least one semiconductor strip, wherein the semiconductor arrangement is formed from the carrier structure and the redistribution layer, and
    detaching the semiconductor arrangement from the substrate.

11. The method according to claim 1, wherein the provision of the semiconductor arrangement comprises the following steps:
    providing a substrate,
    manufacturing the redistribution layer comprising the flexible material and the at least one strip conductor, on the substrate,
    arranging the at least one semiconductor chip on the redistribution layer,
    creating an electrical contact between the at least one semiconductor chip and the redistribution layer, potting the at least one semiconductor chip with the potting compound, so that the carrier structure comprising the potting compound and the at least one semiconductor chip incorporated therein is formed, wherein the semiconductor arrangement is formed from the carrier structure and the redistribution layer, and detaching the semiconductor arrangement from the substrate.

\* \* \* \* \*